US008953329B1

(12) United States Patent
Heydari

(10) Patent No.: US 8,953,329 B1
(45) Date of Patent: Feb. 10, 2015

(54) SERVER CHASSIS BRACKET

(71) Applicant: Twitter, Inc., San Francisco, CA (US)

(72) Inventor: Ali Heydari, Albany, CA (US)

(73) Assignee: Twitter, Inc., San Francisco, CA (US)

( * ) Notice: Subject to any disclaimer, the term of this patent is extended or adjusted under 35 U.S.C. 154(b) by 180 days.

(21) Appl. No.: 13/764,537

(22) Filed: Feb. 11, 2013

(51) Int. Cl.
H05K 7/00 (2006.01)
G06F 1/16 (2006.01)

(52) U.S. Cl.
CPC .................................. G06F 1/16 (2013.01)
USPC ........... 361/732; 361/726; 361/740; 361/735; 361/741; 361/742

(58) Field of Classification Search
USPC ......... 361/726, 740, 735, 741, 742, 807, 810, 361/825, 826; 248/65, 103
See application file for complete search history.

(56) References Cited

U.S. PATENT DOCUMENTS

| 8,625,288 | B1 * | 1/2014 | Liu et al. ...................... 361/727 |
| 2010/0039765 | A1 * | 2/2010 | Antonuccio et al. ..... 361/679.34 |
| 2013/0240464 | A1 * | 9/2013 | Sauer ............................ 211/26 |
| 2014/0252197 | A1 * | 9/2014 | Doglio ........................ 248/562 |

FOREIGN PATENT DOCUMENTS

CA    2360115  A1 *  4/2002

OTHER PUBLICATIONS

"ISODAMP and VersaDamp Grommets" http://www.earsc.com/grommets.asp?bid=215 Available Nov. 4, 2010 (2 pages).

* cited by examiner

Primary Examiner — Jinhee Lee
Assistant Examiner — Mandeep Buttar
(74) Attorney, Agent, or Firm — Osha Liang LLP

(57) ABSTRACT

A server chassis bracket (SCB), including: a first set of holes configured to secure a first set of grommets gripping a first server component; a second set of holes configured to secure a second set of grommets gripping a second server component; a first shared guide configured to: guide a first grommet of the first set of grommets towards a first hole of the first set of holes; and guide a second grommet of the second set of grommets towards a second hole of the second set of holes; and a latch covering a portion of the first shared guide, including a tail, and configured to: generate a first audio verification of a successful installation of the first server component into the server chassis bracket; and generate a second audio verification of a successful installation of the second server component into the server chassis bracket.

20 Claims, 15 Drawing Sheets

Grommet Dimensions 515

| Load (lb) | Dimensions (inches) | | | | | | | |
|---|---|---|---|---|---|---|---|---|
| Recommended Maximum | a Plate Thckns. | b Hole Diam. | c Inside Diam. | d Overall Height | e Outside Diam. | f Edge Radius | g Rib Height | h Rib Width |
| 3.0 | 0.057 | 0.250 | 0.158 | 0.230 | 0.379 | 0.050 | 0.040 | 0.050 |

Grommet Material 520

| C-1105 - Vinyl Solid | V-2325 TPR Thermoplastic |

SERVER CHASSIS BRACKET

SUMMARY

In general, in one aspect, the invention relates to a server chassis bracket (SCB). The SCB comprises: a first plurality of holes configured to secure a first plurality of grommets gripping a first server component; a second plurality of holes configured to secure a second plurality of grommets gripping a second server component; a first shared guide configured to: guide a first grommet of the first plurality of grommets towards a first hole of the first plurality of holes; and guide a second grommet of the second plurality of grommets towards a second hole of the second plurality of holes; and a first latch covering a portion of the first shared guide, comprising a tail, and configured to: generate a first audio verification of a successful installation of the first server component into the server chassis bracket; and generate a second audio verification of a successful installation of the second server component into the server chassis bracket.

In general, in one aspect, the invention relates to a server chassis. The server chassis comprises: a floor; a plurality of sides; a first server chassis bracket (SCB) comprising a plurality of sidewalls; and a first plurality of rivets securing the plurality of sidewalls to the plurality of sides and reducing sagging of the floor by compressing the plurality of sides and bowing the floor.

In general, in one aspect, the invention relates to a method for managing a server chassis bracket (SCB) and a server chassis. The method comprises: inserting a first grommet into a single guide of the SCB and a second grommet into a shared guide of the SCB partially covered by a latch, wherein the first grommet and the second grommet grip a server component; sliding the first grommet towards a first hole using the single guide and the second grommet towards a second hole using the shared guide, wherein the single guide and the first hole are located within a first cutout in the SCB, and wherein the shared guide and the second hole are located within a second cutout in the SCB; pushing the first grommet past a neck in the first cutout into the first hole and pushing the second grommet past a neck in the second cutout into the second hole, wherein the latch strikes the server component when the second grommet slides into the second hole to confirm successful installation of the server component.

In general, in one aspect, the invention relates to a method of manufacture. The method comprises: obtaining a first server chassis bracket (SCB) comprising a first plurality of sidewalls; obtaining a server chassis comprising a floor and a plurality of sides; and securing the plurality of sidewalls to the plurality of sides, wherein securing the plurality of sidewalls reduces sagging of the server chassis by compressing the plurality of sides and bowing the floor.

Other aspects of the invention will be apparent from the following description and the appended claims.

DETAILED DESCRIPTION

Figure 1:
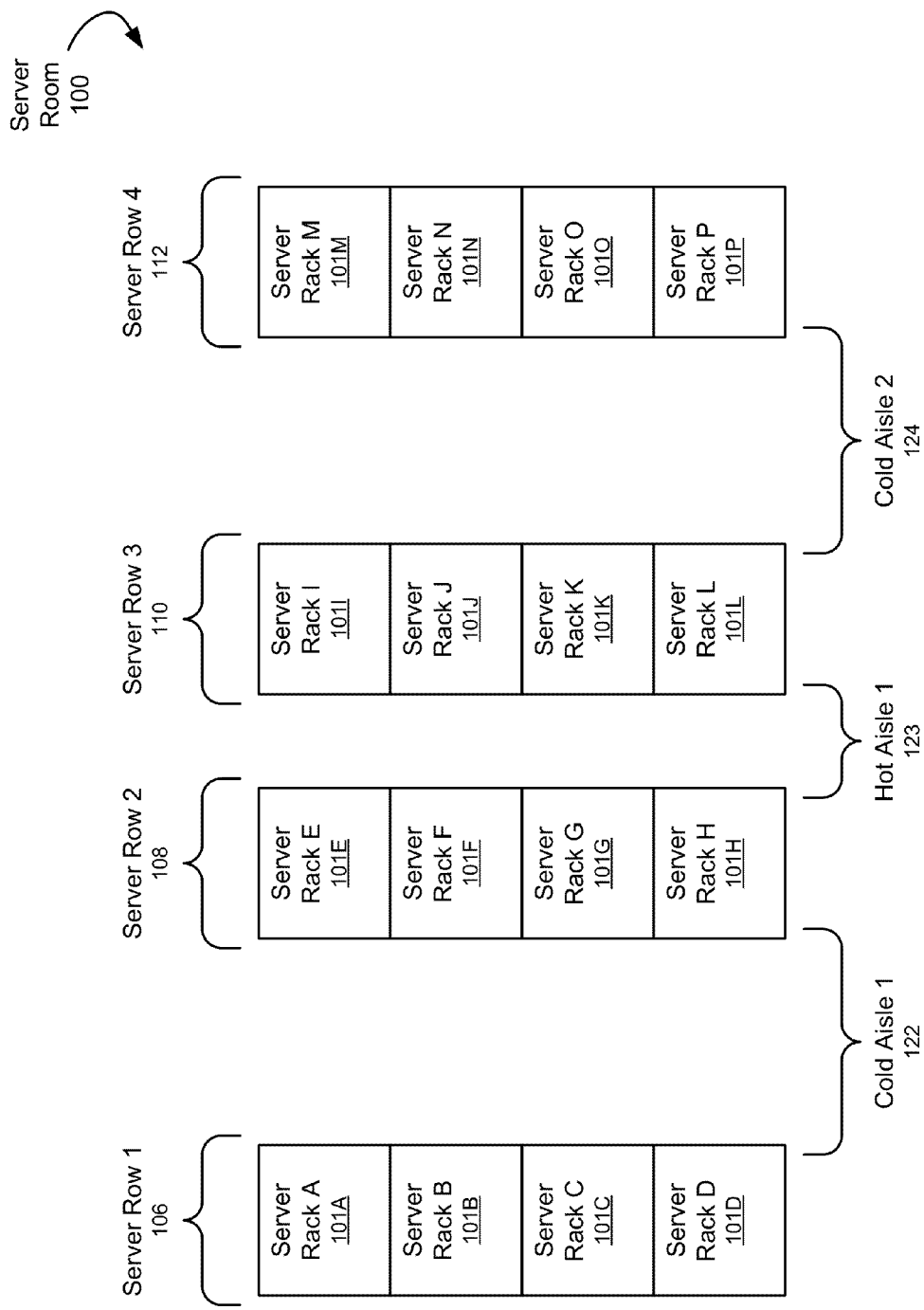
FIG. 1 shows a server room in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a server chassis bracket. The server chassis bracket includes multiple cutouts, and each cutout includes a guide and at least one hole. The guides are used to slide grommets gripping a server component (e.g., hard drive, memory, etc.) towards the holes during the installation of the server component. The server chassis bracket also includes one or more latches configured to generate an audio verification that the server component has been successfully installed.

In general, embodiments of the invention relate to a server chassis bracket used to reduce the sagging of a server chassis. Specifically, the server chassis houses the server chassis bracket and the installed server components. The sidewalls of the server chassis bracket are secured (e.g., riveted) to the sides of the server chassis. This effectively compresses the sides of the server chassis and causes the floor of the server chassis to bow upwards, counteracting/reducing the sagging. The floor of the server chassis may also be secured to the server chassis bracket.

FIG. 1 shows a server room (100) in accordance with one or more embodiments of the invention. As shown in FIG. 1, the server room (100) has multiple server rows (i.e., Server Row 1 (106), Server Row 2 (108), Server Row 3 (110), Server Row 4 (112)). Moreover, each server row (106, 108, 110, 112) has multiple server racks. For example, server row 1 (106) has server rack A (101A), server rack B (101B), server rack C (101C), and server rack D (101D). Further, server row 2 (108) has server rack E (101E), server rack F (101F), server rack G (101G), and server rack H (101H). Further, server row 3 (110) has server rack I (101I), server rack J (101J), server rack K (101K), and server rack L (101L). Further still, server row 4 (112) has server rack M (101M), server rack N (101N), server rack O (101O) and server rack P (101P). Each server rack (101A-101P) stores one or more servers and/or power components.

Still referring to FIG. 1, server rows (106, 108, 110, 112) are separated by alternating cold aisles (e.g., Cold Aisle 1 (122), Cold Aisle 2 (124)) and hot aisles (e.g., Hot Aisle 1 (123)). Specifically, the servers in a server rack (101A-101P) draw in cool air from a cold aisle (122, 124) (i.e., to cool the server components) and expel air into a hot aisle. For example, the servers in server row 2 (108) draw in cool air from cold aisle 1 (122), while the servers in server row 3 (110) draw in cool air from cold aisle 2 (124). The servers in server row 2 (108) and server row 3 (110) expel hot air into hot aisle 1 (123).

Figure 2:
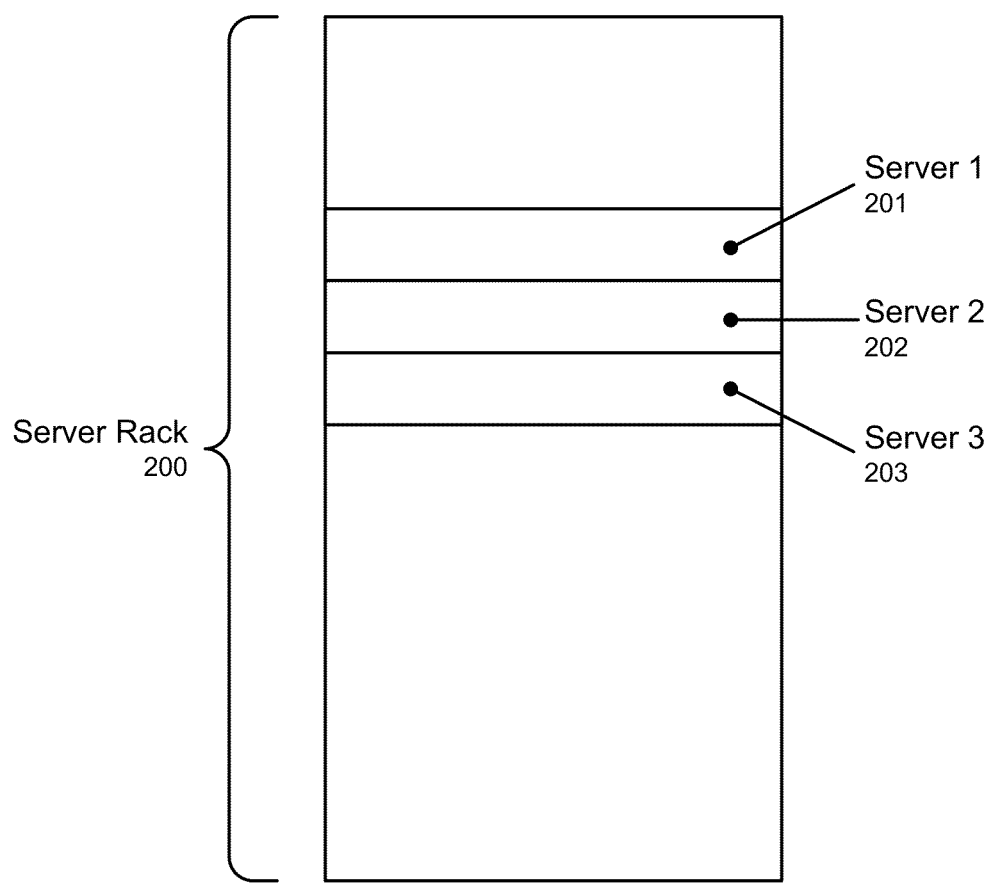
FIG. 2 shows a server rack in accordance with one or more embodiments of the invention.

FIG. 2 shows a server rack (200) in accordance with one or more embodiments of the invention. The server rack (200) may correspond to any of the server racks (101A-101P), discussed above in reference to FIG. 1. As shown in FIG. 2, the server rack (200) houses multiple servers (i.e., Server 1 (201), Server 2 (202), and Server 3 (203)) and/or power components (not shown). The servers (201, 202, 203) are like shelves in the server rack (200). In other words, the servers (201, 202, 203) are held in place by the contact between the sides of the servers (201, 202, 203) and the server rack (200). The server rack (200) may store any number of servers. Moreover, in order to increase the sever capacity of the storage rack (200) (i.e., the number of servers the storage rack can hold), there may be less than 2 mm clearance between two neighboring servers.

Figure 3:
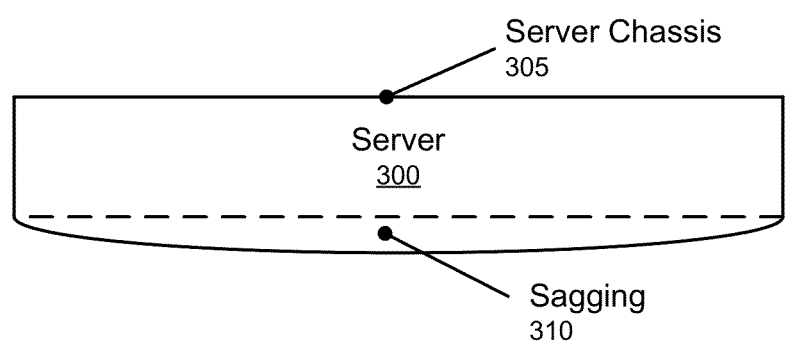
FIG. 3, FIG. 4A, and FIG. 4B show servers in accordance with one or more embodiments of the invention.

FIG. 3 shows a server (300) in accordance with one or more embodiments of the invention. The server (300) may correspond to any of the servers (201, 202, 203) discussed above in reference to FIG. 2. As shown in FIG. 3, the case of the server (300) (i.e., box/shell/structure enclosing all or part of the server (300)) may be referred to as the server chassis (305). The server chassis (305) may have a lid that can be removed to access/install the items (e.g., circuit boards, server components, electrical wiring, fan, fan walls, metal hardware, etc.) within the server chassis (305). Those skilled in the art, having the benefit of this detailed description, will appreciate that as more and more items are mounted/installed/placed within the server (300), the floor of the server chassis (305) may begin to sag from the weight of these items. The sagging (310) may interfere with the tight clearance between neighboring servers in the server rack. Specifically, the sagging (310) may prohibit close placement of neighboring servers within a server rack and thus reduce the overall capacity of the server rack. The dashed lined in FIG. 3 represents the floor of the server chassis (305) when sagging is not present.

Figure 4A:
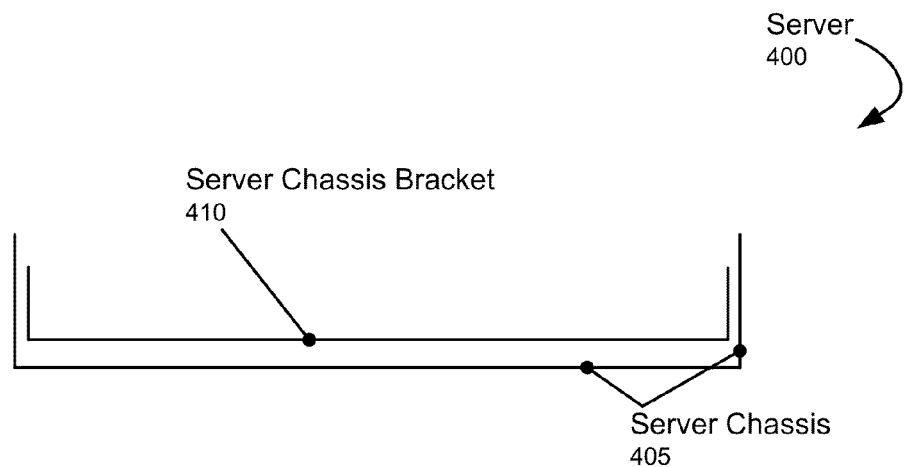

FIG. 4A shows a cross-section of a server (400) in accordance with one or more embodiments of the invention. The server chassis (405) may correspond to the server chassis (305), discussed above in reference to FIG. 3. Although the floor of the server chassis (405) is shown as flat, in one or more embodiments of the invention, the floor of the server chassis bracket (410) is manufactured with a concave shape. The floor of the chassis may be constructed from relatively thin sheet metal. As shown in FIG. 4A, the server includes a server chassis bracket (410). The width of the server chassis bracket (410) is slightly less than the width of the server chassis (405). Moreover, the server chassis bracket (410) may be constructed from material (e.g., metal, plastic, etc.) more rigid than the material of the server chassis (405). In one or more embodiments of the invention, the server chassis bracket (410) and the server chassis (405) are constructed from the same or similar material. In this case, the greater relative rigidity of the server chassis bracket (410) (as compared to the server chassis (405)) can be due to a shape of the server chassis bracket (410). For example, the server chassis bracket (410) can have a thicker cross-section than the server chassis (405) and/or can be reinforced with one or more intersecting struts to add structural rigidity.

Figure 4B:
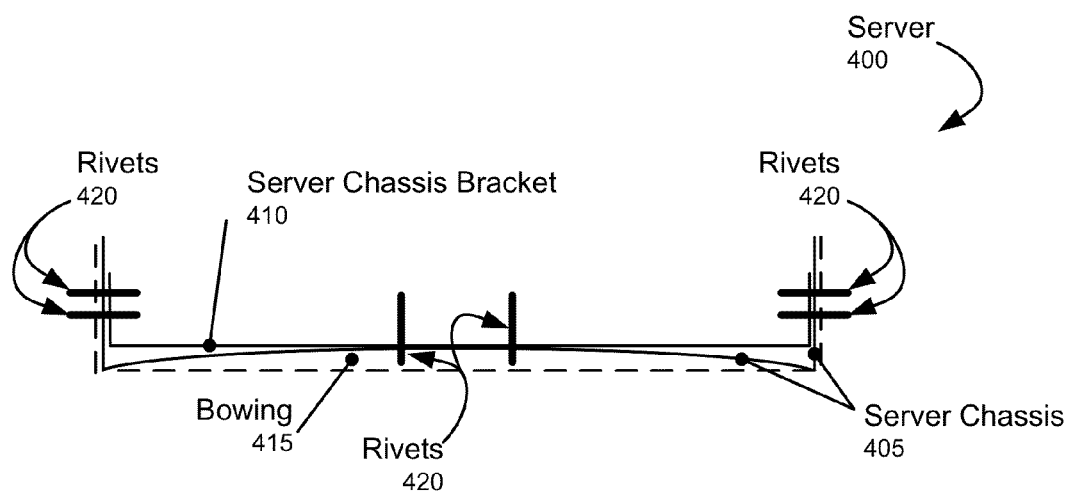

FIG. 4B shows the cross-section of the server (400) after securing the server chassis bracket (410) to the server chassis (405). As shown in FIG. 4B, one or more rivets (420) are used to secure the server chassis bracket (410) to the server chassis (405). In one or more embodiments of the invention, only the side walls of the server chassis bracket (410) are secured to the sides of the server chassis (405). In one or more embodiments of the invention, the floor of the server chassis (405) is also secured to the server chassis bracket (410).

As discussed above, the width of the server chassis bracket (410) is slightly less than the width of the server chassis (405). Accordingly, by securing the sidewalls of the server chassis bracket (410) to the sides of the server chassis (405), the sides of the server chassis (405) are compressed, and the floor of the server chassis (405) bows upwards as a result. This bowing (415) may act as a countermeasure to the sagging (310), discussed above in reference to FIG. 3. In other words, this bowing (415) may reduce or even eliminate the sagging (310), and thus permit close placement of neighboring servers within a server rack (i.e., increasing capacity of the server rack). The dashed lines in FIG. 4B represent the floor of the server chassis (405) prior to bowing and the sides of the server chassis (405) prior to compression. Any number of rivets can be placed at any location in order to secure the sides of the server chassis (405) to the sidewalls of the server chassis bracket (410), in accordance with various embodiments of the invention. Similarly, any number of rivets can be placed at any location in order to secure the floor of the server chassis (405) to the server chassis bracket (410), in accordance with various embodiments of the invention. For example, a single rivet placed at a mid-point of the server chassis bracket (410) can be used to secure each server chassis bracket (410) to the floor of the server chassis (405). Furthermore, in one or more embodiments of the invention, the rivets can be secured in a specific order in order to ensure that the upward bowing of the floor of the server chassis (405) takes place. For example, one or more rivets can be used to secure the floor of the server chassis (405) to the server chassis bracket (410) prior to securing the securing the sidewalls of the server chassis bracket (410) to the sides of the server chassis (405).

Although FIG. 4B only shows a single server chassis bracket (410) mounted within the server chassis (405), any number (e.g., 3) of server chassis brackets may be mounted within the server chassis (405), and one or more of the server chassis brackets may be secured to the server chassis (405), as discussed above, to reduce sagging (310).

Figure 5A:
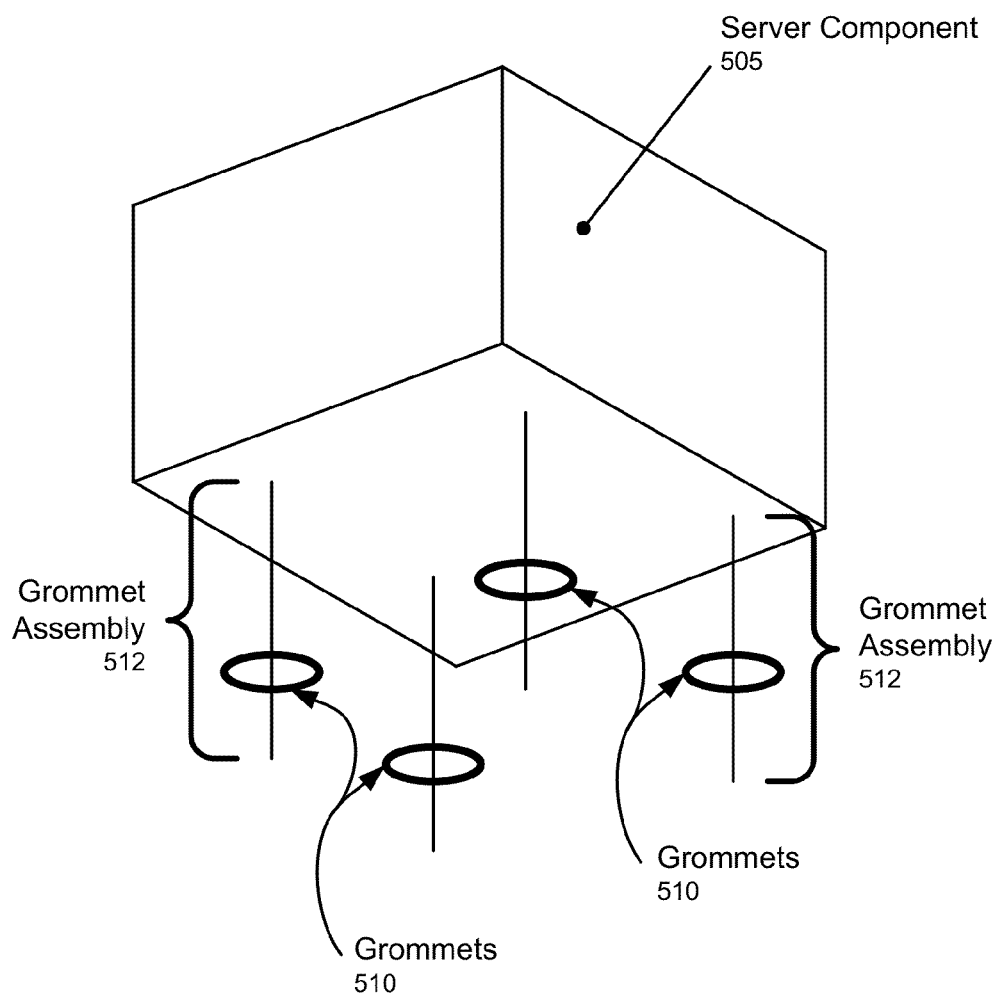
FIG. 5A shows a server component in accordance with one or more embodiments of the invention.

FIG. 5A shows a server component (505) in accordance with one or more embodiments of the invention. The server component (505) may correspond to a hard drive; a memory; a processor; a co-processor for floating point arithmetic, graphics, signal processing, string processing, encryption or I/O Interfacing with peripheral devices; or any other hardware component that may be present within a server. Although FIG. 5A shows the server component (505) as having a rectangular box shape, the server component (505) may have any shape and may be of any size.

In one or more embodiments of the invention, there exists multiple grommet assemblies (512) each having at least one grommet (510). The grommet assemblies (512) make it possible for the grommets (510) to grip the server component (505). For example, the grommet assemblies (512) may include screws/legs/extensions that attach to the server component (505). The grommets (510) are effectively able to grip the server component (505) by gripping the screws/legs/prongs attached to the server component (505). In one or more embodiments of the invention, the grommet assemblies (512) are optional. In such embodiments, the shape and/or structure or the server component (505) permit the grommets (510) to directly grip the server component (505).

The grommets (510) are used to install the server component (505) in a server chassis bracket (discussed below).

Figure 5B:
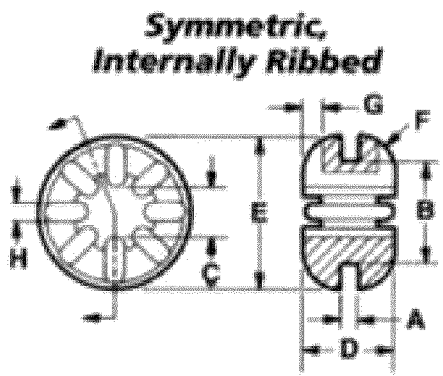
FIG. 5B shows grommet dimensions in accordance with one or more embodiments of the invention.

Although FIG. 5A shows four grommets (510) gripping the server component (505), any number of grommets (510) may be used to grip the server component (505). Once the server component is installed in a server chassis bracket, the grommets (510) may effectively isolate, at least partially, the server component (505) from electrical, thermal, and/or vibration type disturbances. FIG. 5B specifies the grommet dimensions (515) and the grommet composite material (520).

Figure 6A:
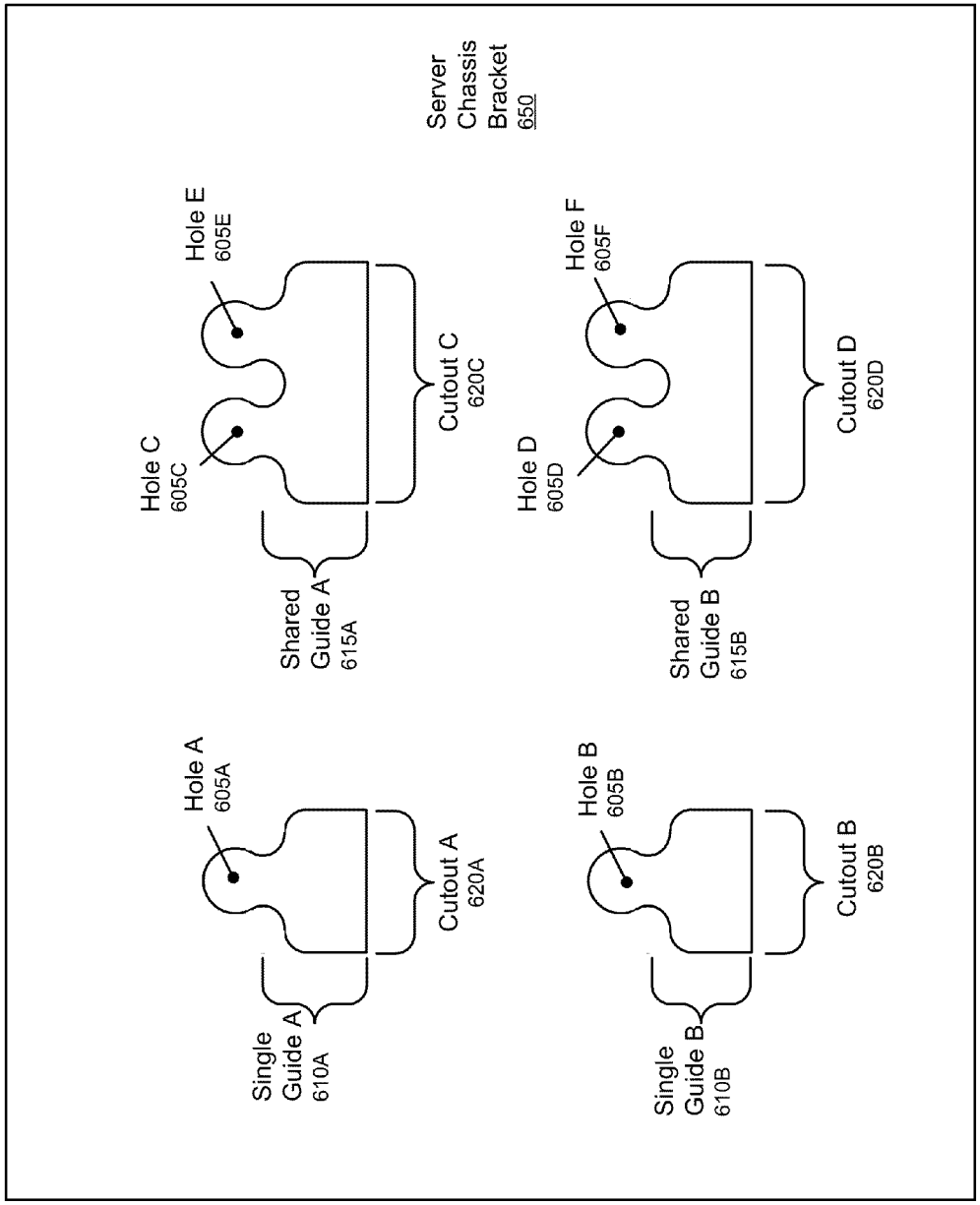
FIG. 6A, FIG. 6B, FIG. 6C, and FIG. 6D show a server chassis bracket in accordance with one or more embodiments of the invention.

FIG. 6A shows a portion of a server chassis bracket (650) in accordance with one or more embodiments of the invention. The server chassis bracket (650) may correspond to the server chassis bracket (410), discussed above in reference to FIG. 4. Moreover, the server chassis bracket (650) may be mounted with a server chassis (not shown).

As shown in FIG. 6A, the server chassis bracket (650) has multiple cutouts (i.e., Cutout A (620A), Cutout B (620B), Cutout C (620C), Cutout D (620D)). Each cutout (620A, 620B, 620C, 620D) has at least one hole. For example, cutout A (620A) and cutout B (620B) have hole A (605A) and hole B (605B), respectively. Further, cutout C (620C) has both hole C (605C) and hole E (605E). Further still, cutout D (620D) has hole D (605D) and hole F (605F). Moreover, each cutout (620A, 620B, 620C, 620D) also has a guide. In the case of cutouts with only one hole (e.g., Cutout A (620A), Cutout B (620B)), the guide is referred to as a single guide (e.g., Single Guide A (610A) and Single Guide B (610B)). In the case of cutouts with multiple holes (e.g., Cutout C (620C), Cutout D (620D)), the guide is referred to as a shared guide (e.g., Shared Guide A (615A), Shared Guide B (615B)). The boundary between a hole and a guide within a cutout is referred to as a neck. In one or more embodiments of the invention, the neck corresponds to the most narrow part of a cutout.

In one or more embodiments of the invention, installed server components sit on top of the server chassis bracket (650). Specifically, the holes (605A, 605B, 605C, 605D, 605E, 605F) are used to secure the grommets (e.g., grommets (510)) gripping the server components. In other words, the grommets effectively plug the holes. Following successful installation, a part of each grommet remains on top of the cutout, while a different part of each grommet remains below the cutout. As each server component may be gripped by four grommets, four holes may be used to install a server component. For example, hole A (605A), hole B (605B), hole C (605C), and hole D (605D) may be used to secure the grommets gripping a single server component. Similarly, hole E (605E) and hole F (605F) plus two additional holes (not shown), may also be used to secure the grommets gripping another server component.

In one or more embodiments of the invention, the guides (610A, 610B, 615A, 615B) are used to slide the grommets gripping one or more server components towards the holes (605A, 605B, 605C, 605D, 605E, 605F). Specifically, at the start of the installation process, the grommets gripping a server component are inserted into the guides (610A, 610B, 615A, 615B) of the cutouts (620A, 620B, 620C, 620D) by an operator. The grommets, and their corresponding server component, are then slid in a direction towards the holes along the guides. Upon reaching the necks of the cutouts, the operator may need to exert additional force to push the grommets past the necks and into the holes.

In one or more embodiments of the invention, the spacing and alignment of the holes (605A, 605B, 605C, 605D), and the locations of the grommets correspond to the screws/legs extending from a standard 3.5" hard drive.

Figure 6B:
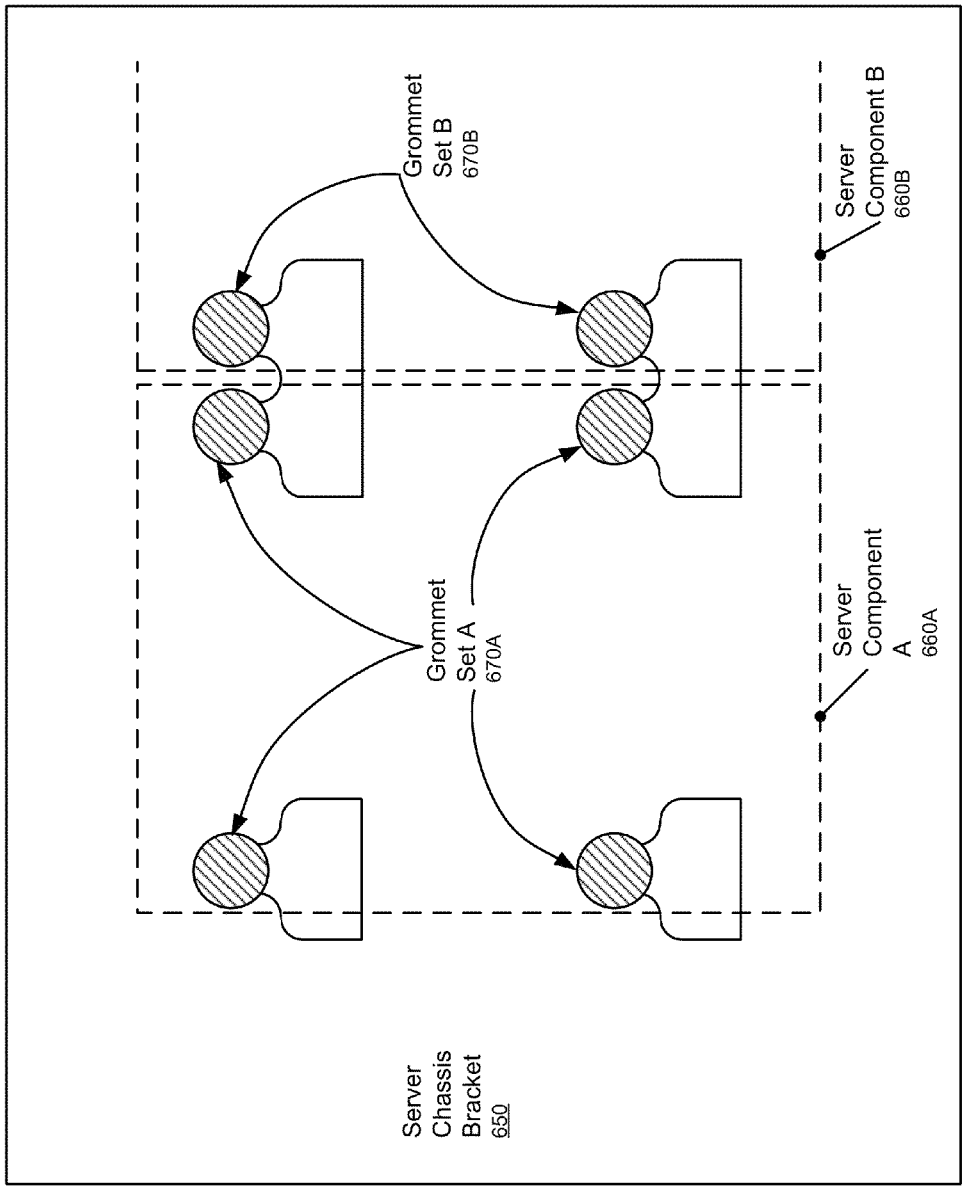

FIG. 6B shows the server chassis bracket (650) following successful installation of server component A (660A) and server component B (660B). As discussed above, both server component A (660A) and server component B (660B) sit above the server chassis bracket (650). In FIG. 6B, only the outlines (i.e., footprints) of server component A (660A) and server component B (660B) are shown. There exists four grommets (i.e., Grommet Set A (670A)) gripping server component A (660A). Similarly, there exists four grommets (Grommet Set B (670B), only two shown) gripping server component B (660B). As shown in FIG. 6B, the grommets of both sets (670A, 670B) are plugging the holes of the cutouts.

Figure 6C:
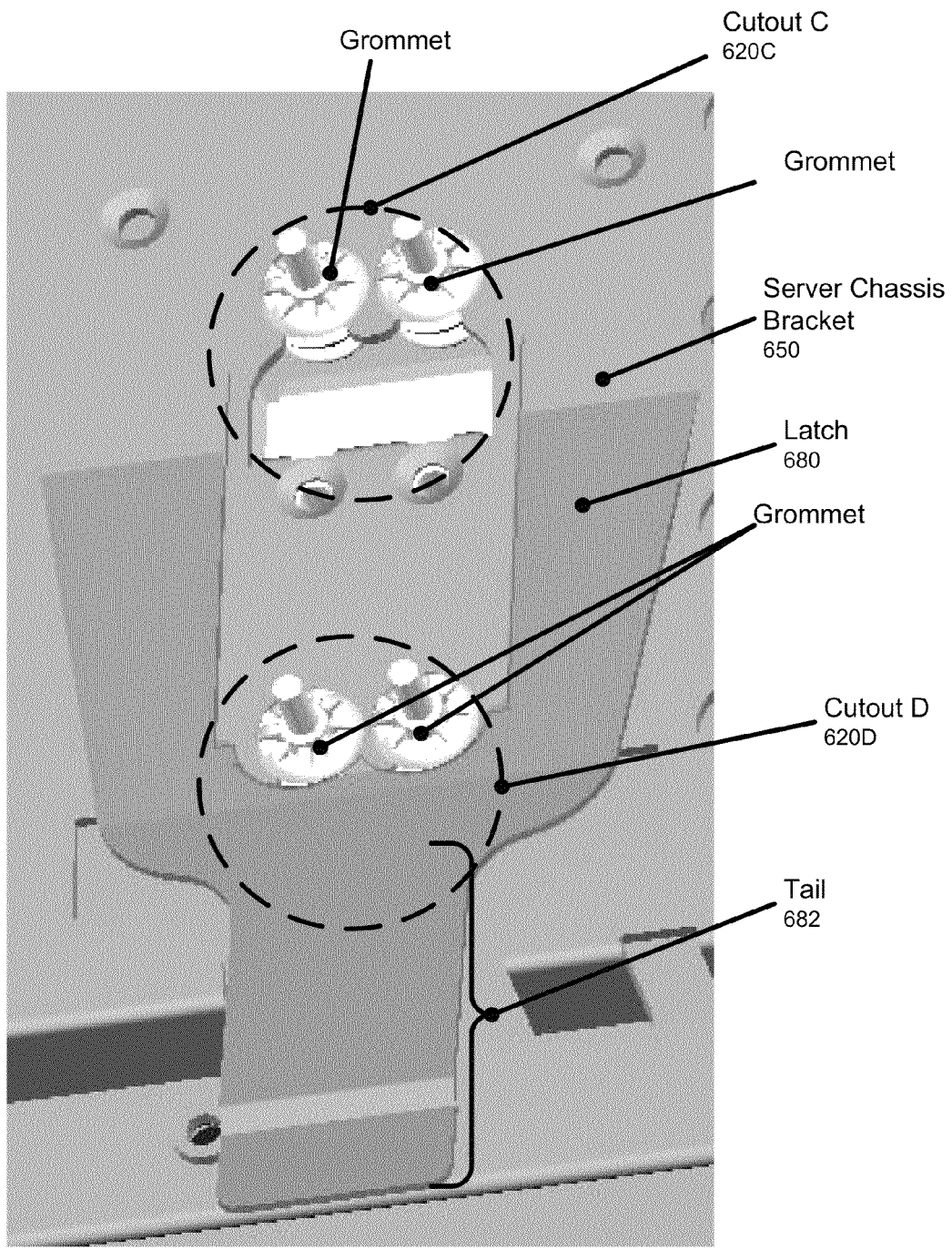

FIG. 6C shows a portion of server chassis bracket (650) with a focus on cutout C (620C) and cutout D (620D). As shown in FIG. 6C, the holes of cutout C (620C) and cutout D (620D) are plugged with grommets. In one or more embodiments of the invention, the server chassis bracket (650) includes a latch (680). The latch (680) may effectively be a "Y" shape piece that wraps around cutout D (620D) and covers a portion of cutout D (620D). For example, the latch (680) covers most, if not all, of shared guide B (615B) in cutout D (620D). In one or more embodiments of the invention, the tail (682) of the latch (680) is not secured to the server chassis bracket (650) (i.e., the tail (682) may swing up and down, discussed below).

As discussed above, during the initial phase of the installation process, the grommets gripping a server component are inserted into the guides. The grommets and their corresponding server component are then slid in a direction towards the holes using the guides. Upon reaching the necks, the operator may use additional force to push the grommets past the necks of the cutouts and into the holes of the cutouts. In the case of cutout D (620D), inserting a grommet into shared guide B (615B) may require pushing downwards on a portion of the latch (680) covering shared guide B (615B). This downwards pushing and subsequent sliding using shared guide B (615B) causes the tail (682) to swing upwards. The final pushing of a grommet past the neck of cutout D (620D) and into a hole of cutout D (620D) causes the tail (682) to strike the server component. The noise generated/emitted from the striking of the tail (682) with the server component is an audio verification corresponding to the successful installation of the server component in the server chassis bracket (650). In other words, visual contact with the server chassis bracket (650) is not required to confirm successful installation of a server component into the server chassis bracket (650). Moreover, a single latch is positioned to secure and provide audio verification for multiple server components (e.g, each latch is shared by two server components).

Figure 6D:
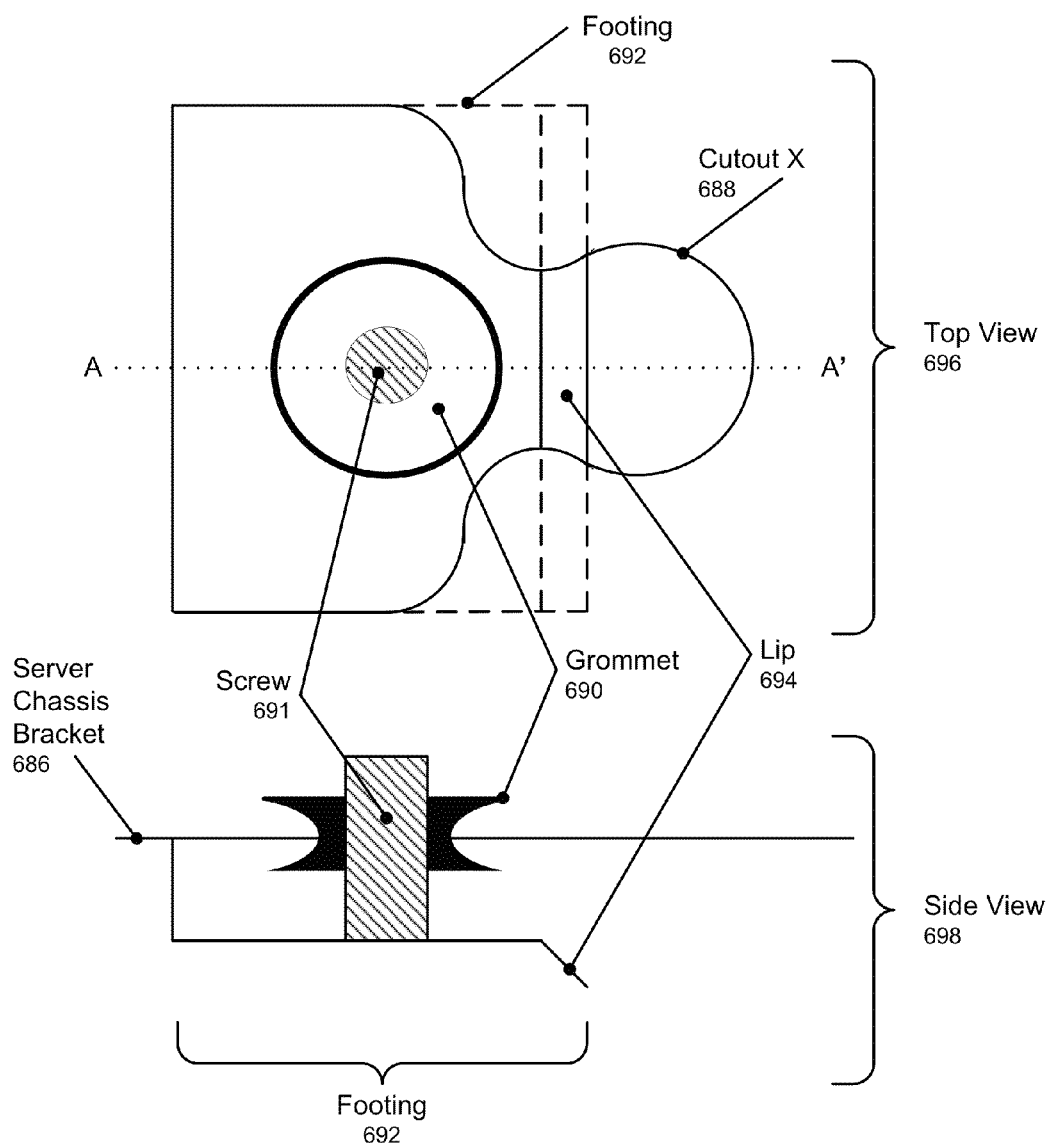

FIG. 6D shows a top view (696) and a side view (698) of cutout X (688) within the server chassis bracket (686) in accordance with one or more embodiments of the invention. Cutout X (688) and the server chassis bracket (686) may correspond to cutout A (620A) and server chassis bracket (650), respectively, discussed above in reference to FIG. 6A. Moreover, the side view (696) is a cross-sectional view of cutout X (688) along the line AA'.

As shown in FIG. 6D, beneath cutout X (688) (and thus below server chassis bracket (686)), there exists a footing (692). The footing (692) is attached (e.g., screwed, welded, inserted, etc.) to the server chassis bracket (686) and hangs below the server chassis bracket (686). Most of the footing (692) is parallel with the server chassis bracket (686). However, below approximately the neck of the cutout X (688), the footing (692) slopes downwards forming a lip (694).

Assume there exists a grommet assembly including a grommet (690) and a screw (691). The screw (691) is attached to a server component (not shown). The grommet (690) effectively grips the server component by gripping the screw (691). In FIG. 6D, the grommet assembly including the grommet (690) and the screw (691) has been inserted into the cutout X (688). As discussed above, this is one of the initial steps in the installation process. As shown in FIG. 6D, the footing (692) prevents the grommet (690) from being inserted too deep into cutout X (688). Specifically, the footing (692) is a barrier that prevents the screw (691) (and thus the grommet (690)) from moving deeper into the cutout. As also discussed above, installing the server component (691) into cutout X (688) requires sliding the server component (691), and thus the screw (691) and grommet (690), towards the hole of cutout X (688). The footing (692) keeps the grommet (690) at the proper height while the server component (691) and screw (691) are sliding towards the hole of cutout X (688). Finally, the lip (694) in unison with the final exertion of force required to push the grommet (690) past the neck of cutout X (688), helps the grommet (692) to correctly fall-into and plug the hole of cutout X (688).

In one or more embodiments of the invention, the lip (694) is used to ease the removal process. Specifically, in order to remove the server component (691) after the grommet (690) is correctly plugging the hole of cutout X (688) (i.e., after the server component (691) is correctly installed), the operator may simply pull backwards on the server component. The slope of the lip (694), in unison with the backwards pull, lifts the grommet (690) out of the hole.

Figure 6E:
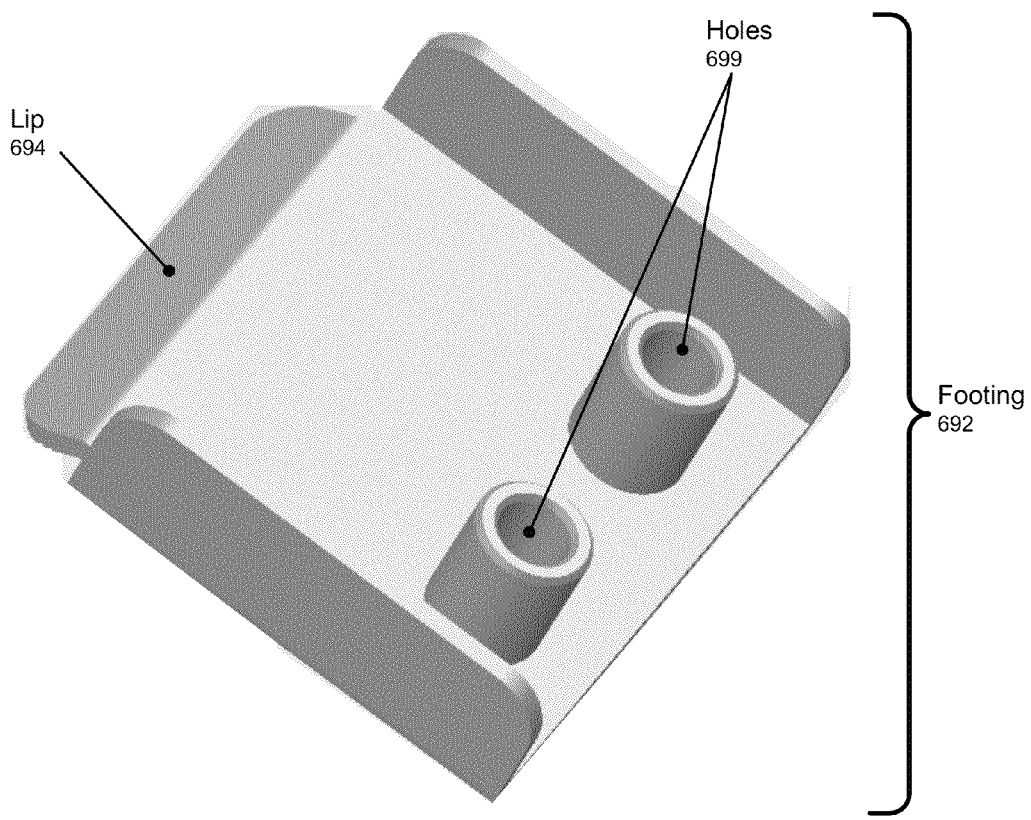
FIG. 6E shows a footing in accordance with one or more embodiments of the invention.

In one or more embodiments of the invention, all cutouts have footings. In one or more embodiments of the invention, only cutouts without latches have footings. In one or more embodiments of the invention, only cutouts with one hole have footings. In one or more embodiments of the invention, only cutouts with multiple holes have footings. FIG. 6E shows just the footing (692) with its lip (694) and the multiple holes (699) that are needed to screw the footing (692) to the server chassis bracket (686).

Figure 7:
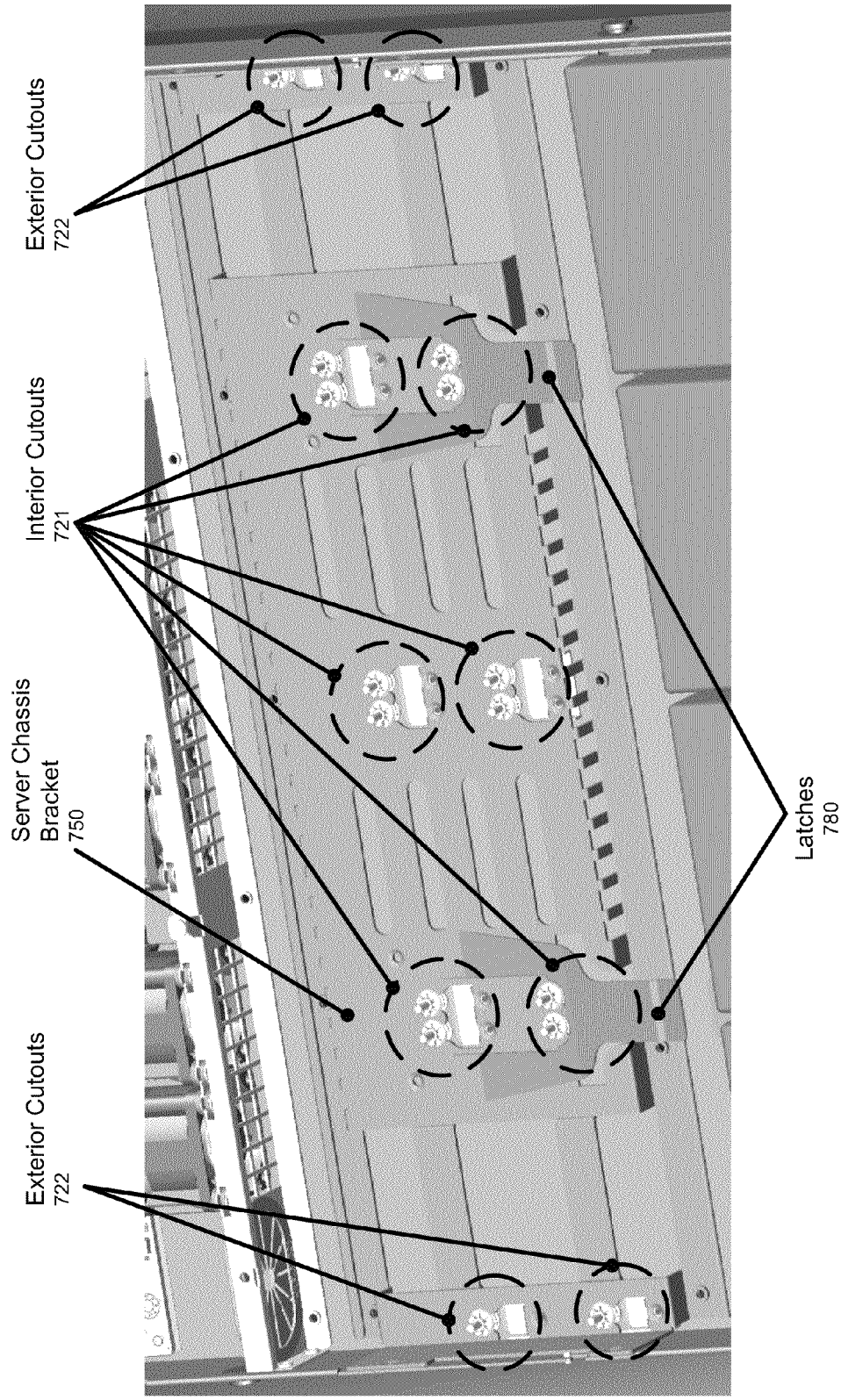
FIG. 7 shows a server chassis bracket in accordance with one or more embodiments of the invention.

FIG. 7 shows a server chassis bracket (750) in accordance with one or more embodiments of the invention. The server chassis bracket (750) may be essentially the same as the server chassis bracket (650), discussed above in reference to FIG. 6A, FIG. 6B, and FIG. 6C. In one or more embodiments of the invention, the server chassis bracket (750) has the following dimensions: 17"W, 32.5"D, 1.75"H, and all sheet metals are 0.5 mm thick.

As shown in FIG. 7, the server chassis bracket (750) includes four exterior cutouts (722). The exterior cutouts (722) are the cutouts that border the sidewalls of the server chassis bracket (750). Each of the exterior cutouts (722) is essentially the same as cutout A (620A), discussed above in reference to FIG. 6A. Accordingly, each of the exterior cutouts (722) has one hole and a single guide. Moreover, each of the exterior cutouts (722) is used to install one server component.

As also shown in FIG. 7, the server chassis bracket (750) includes six interior cutouts (721). The interior cutouts (721) are the cutouts that do not border the sidewalls of the server chassis bracket (750). Each of the interior cutouts (721) is essentially the same as cutout D (620D), discussed above in reference to FIG. 6A. Accordingly, each of the exterior cutouts (721) has two holes and a shared guide. Moreover, each of the interior cutouts (721) is used to install two server components.

Those skilled in the art, having the benefit of this detailed description, will appreciate that four server components may be installed into the server chassis bracket (750) using the exterior cutouts (722) and the interior cutouts (721).

Still referring to FIG. 7, the server chassis bracket (750) includes two latches (780). In one or more embodiments of the invention, the latches (780) are only placed on the interior cutouts (721) that are adjacent to the exterior cutouts (722). Each of the two latches (780) is essentially the same as the latch (680), discussed above in reference to FIG. 6C. Although there are only two latches (780), these two latches (780) may be used to generate audio verifications corresponding to the successful installation of all four server components into the server chassis bracket (750). In other words, each latch is positioned to secure and provide audio verification for multiple server components (e.g., each latch is shared by two server components).

Figure 8:
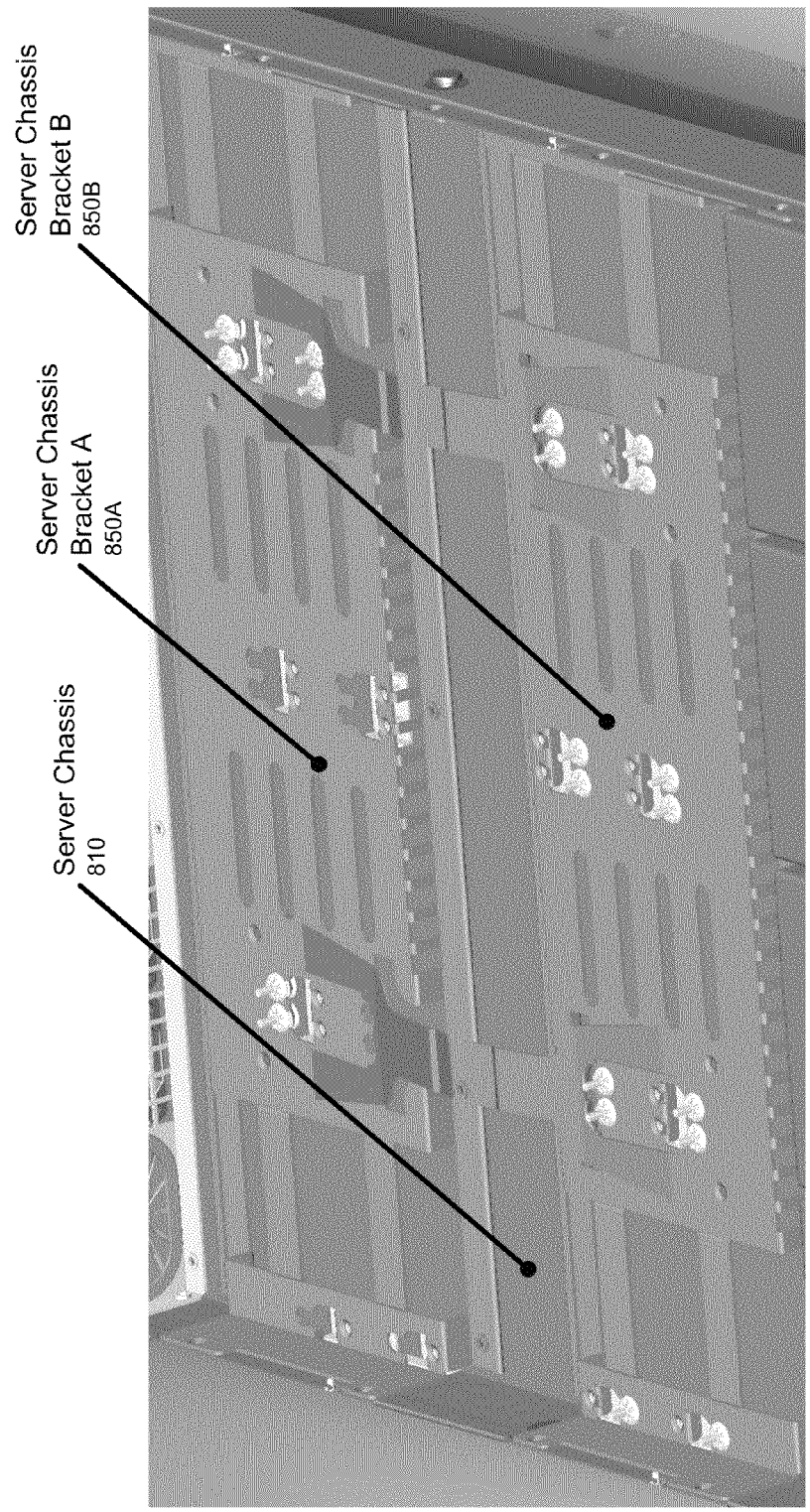
FIG. 8 shows a server chassis in accordance with one or more embodiments of the invention.

FIG. 8 shows a server chassis (810) in accordance with one or more embodiments of the invention. The server chassis (810) may be essentially the same as the server chassis (405), discussed above in reference to FIG. 4. As shown in FIG. 8, multiple server chassis brackets (i.e., Server Chassis Bracket A (850A), Server Chassis Bracket B (850B)) are installed in the server chassis (810). Server chassis bracket A (850A) may be essentially the same as server chassis bracket (750), discussed above in reference to FIG. 7. Server chassis bracket B (850B) is essentially the mirror image of server chassis bracket A (850A). In other words, a server component being installed in server chassis bracket A (850A) and a server component being installed in server chassis bracket B (850B) would need to slide, within their respective guides, in opposite directions. Although only two server chassis brackets (850A, 850B) are shown in FIG. 8, the server chassis (810) may have any number (e.g., 3) of server chassis brackets.

Figure 9:
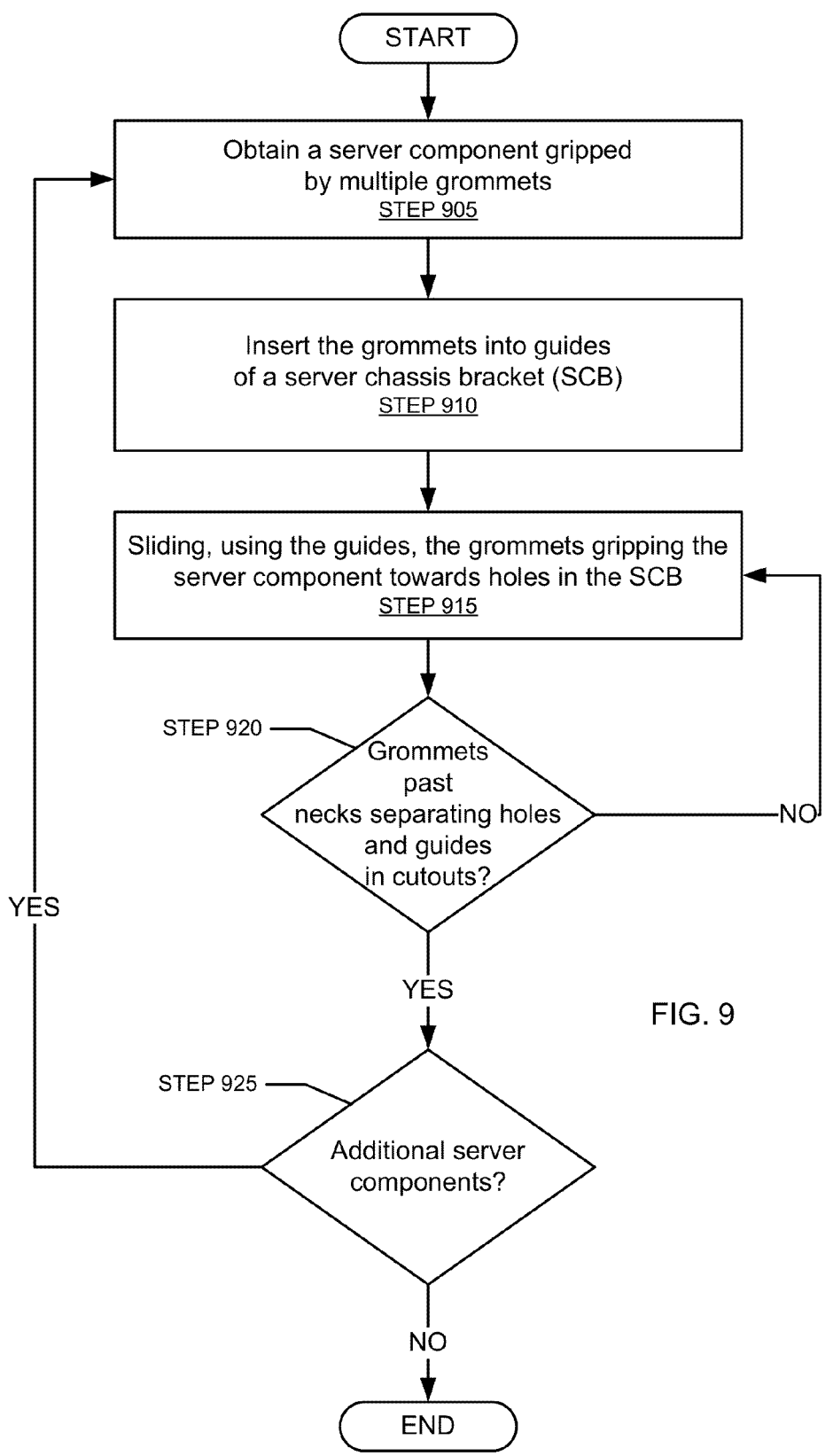
FIG. 9 and FIG. 10 show flowcharts in accordance with one or more embodiments of the invention.

FIG. 9 shows a flowchart in accordance with one or more embodiments of the invention. One or more steps shown in FIG. 9 may be omitted, repeated, and/or performed in a different order among different embodiments of the invention. Accordingly, embodiments of the invention should not be considered limited to the specific number and arrangement of steps shown in FIG. 9.

Initially, a server component is obtained for installation in a server (STEP 905). The server component may be gripped by multiple grommets. As discussed above, the server component may correspond to a hard drive, a memory, a processor, a co-processor, or any other hardware component that may be present within the server. In one or more embodiments of the invention, four grommets are used to grip the server component.

In STEP 910, the grommets are inserted into the guides of cutouts within a server chassis bracket. As discussed above, depending on the position of the server component within the server chassis bracket, the guides may be single guides of exterior cutouts and/or the guides may be shared guides of interior cutouts. In one or more embodiments of the invention, at least one of the shared guides is partially covered by a latch. In such embodiments, inserting the grommet into the shared guide includes pushing downtowns on the latch.

In STEP 915, the grommets and their corresponding server component are slid, using the guides, towards the holes of the cutouts. Upon reaching the necks in the cutouts separating the guides and the holes, additional force may be necessary to push the grommets past the necks and into the holes.

In STEP 920, it is determined whether the grommets are past the necks in the cutouts. In other words, it is determined whether the grommets are now plugging the holes of the cutouts. In one or more embodiments of the invention, an audio verification generated by a latch confirms STEP 920 is true. As discussed above, the final pushing of a grommet past the neck of cutout associated with a latch and into a hole of the cutout causes the tail of the latch to strike the server component. The noise generated/emitted from the striking of the tail with the server component is an audio verification corresponding to the successful installation of the server component in the server chassis bracket.

When it is determined that STEP 920 is true (i.e., audio verification), the process proceeds to STEP 925. When it is determined that STEP 920 is false, the process returns to STEP 915.

In STEP 925, when it is determined that additional components require installation in the server bracket, the process returns to STEP 905. Otherwise, the process ends.

Figure 10:
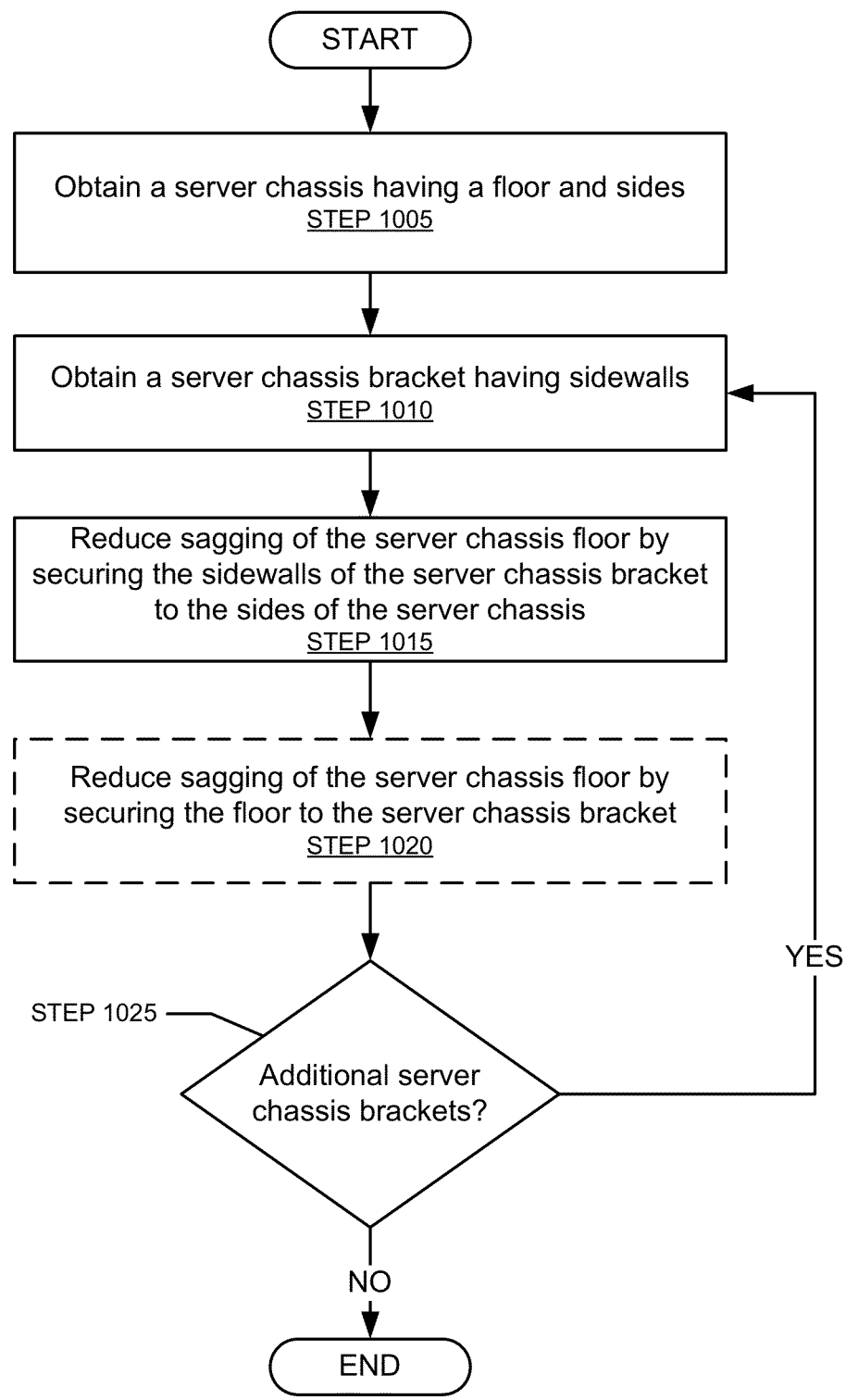

FIG. 10 shows a flowchart in accordance with one or more embodiments of the invention. The process in FIG. 10 may correspond to a method of manufacture. One or more steps shown in FIG. 10 may be omitted, repeated, and/or performed in a different order among different embodiments of the invention. Accordingly, embodiments of the invention should not be considered limited to the specific number and arrangement of steps shown in FIG. 10.

Initially, a server chassis is obtained (STEP 1005). As discussed above, the server chassis is the outer shell of a server. Accordingly, the server chassis has sides and a floor. The server chassis may also have a lid.

In STEP 1010, a server chassis bracket is obtained (STEP 1010) for installation in the server chassis. The server chassis bracket has sidewalls. As discussed above, multiple server components may be (eventually) installed on the server chassis bracket.

As discussed above, as more and more items (e.g., circuit boards, server components, electrical wiring, fan, fan walls, metal hardware, etc.) are mounted/installed/placed within the server chassis, the floor of the server chassis may begin to sag from the weight of these items. The sagging may interfere with the tight clearance between neighboring servers in a server rack. Specifically, the sagging may prohibit close placement of neighboring servers within a server rack and thus reduce the overall capacity of the server rack.

In STEP 1015, the sidewalls of the server chassis bracket are secured (e.g., using rivets) to the server chassis. As the width of the server chassis bracket is slightly less than the width of the server chassis, by securing the sidewalls of the server chassis bracket to the sides of the server chassis, the sides of the server chassis are compressed, and the floor of the server chassis bows upwards. This bowing may act as a countermeasure to the sagging. In other words, this bowing may reduce or even eliminate the sagging, and thus permit close placement of neighboring servers within a server rack (i.e., increasing capacity of the server rack).

In STEP 1020, the floor of the server chassis is secured to the server chassis bracket. This too reduces the sagging by encouraging the floor of the server chassis to bow upwards. In one or more embodiments of the invention, STEP 1020 is optional.

In STEP 1025, it is determined whether additional server chassis brackets are present for installation in the server chassis. In one or more embodiments of the invention, the server chassis may accommodate up to three server chassis brackets. When additional server chassis brackets are present, the process returns to STEP 1010. Otherwise, the process ends.

Embodiments of the invention may have one or more of the following advantages: the ability to install four server components on a single server chassis bracket; the ability to install three server chassis brackets within a single server chassis; the ability to have 12 server components (e.g., hard drives) within a single server chassis; the ability to generate an audio confirmation of a successful server component installation using a latch; the ability to install a server component in a server chassis bracket without visual contact but instead by relying on the audio confirmation; the ability to reduce the sagging of a server chassis floor and thus improve/increase capacity of a server rack; the ability to reduce the sagging of a server chassis floor by securing (e.g., riveting) the sidewalls of one or more server chassis brackets to the sides of the server chassis; the ability to reduce the sagging of a server chassis floor by securing the floor to one or more server chassis brackets; etc.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A server chassis bracket (SCB), comprising:
   a first plurality of holes configured to secure a first plurality of grommets gripping a first server component;
   a second plurality of holes configured to secure a second plurality of grommets gripping a second server component;
   a first shared guide configured to:
      guide a first grommet of the first plurality of grommets towards a first hole of the first plurality of holes; and
      guide a second grommet of the second plurality of grommets towards a second hole of the second plurality of holes; and
   a first latch covering a portion of the first shared guide, comprising a tail, and configured to:
      generate a first audio verification of a successful installation of the first server component into the server chassis bracket; and
      generate a second audio verification of a successful installation of the second server component into the server chassis bracket.

2. The SCB of claim 1, further comprising:
   a plurality of single guides configured to slide a set of the first plurality of grommets into a set of the first plurality of holes.

3. The SCB of claim 1, wherein the first server component is a hard disk.

4. The SCB of claim 1, wherein the first shared guide and the first hole are separated by a neck within a cutout.

5. The SCB of claim 1, wherein the first plurality of holes has a cardinality of four, and wherein the first plurality of grommets has a cardinality of four.

6. The SCB of claim 1, wherein the first audio verification is generated by the tail of the first latch striking the first server component when at least the first grommet slides into the first hole.

7. The SCB of claim 1, further comprising:
   a plurality of sidewalls; and
   a plurality of rivets securing the plurality of sidewalls to a server chassis comprising a floor and a plurality of sides,
   wherein securing the plurality of sidewalls reduces sagging of the server chassis by compressing the plurality of sides and bowing the floor.

8. The SCB of claim 1, further comprising:
   a third plurality of holes configured to secure a third plurality of grommets gripping a third server component;
   a fourth plurality of holes configured to secure a fourth plurality of grommets gripping a fourth server component;
   a second shared guide configured to:
      guide a third grommet of the third plurality of grommets towards a third hole of the third plurality of holes; and guide a fourth grommet of the fourth plurality of grommets towards a fourth hole of the fourth plurality of holes; and a second latch covering a portion of the second shared guide and configured to generate an audio verification of a successful installation of at least one selected from a group consisting of the third server component and the fourth server component into the server chassis bracket.

9. A server chassis, comprising:
a floor;
a plurality of sides;
a first server chassis bracket (SCB) comprising a plurality of sidewalls; and
a first plurality of rivets securing the plurality of sidewalls to the plurality of sides and reducing sagging of the floor by compressing the plurality of sides and bowing the floor.

10. The server chassis of claim 9, further comprising:
a second plurality of rivets securing the first SCB to the floor.

11. The server chassis of claim 9, wherein the first SCB further comprises:
a first plurality of holes configured to secure a first plurality of grommets gripping a first plurality of server components;
a first plurality to guides configured to guide the first plurality of grommets in a first direction towards the first plurality of holes; and
a first plurality of latches comprising a first plurality of tails configured to strike the first plurality of server components when the first plurality of grommets slide into the first plurality of holes.

12. The server chassis of claim 11, wherein the first plurality of server components comprises at least one hard disk.

13. The server chassis of claim 11, further comprising:
a second SCB comprising:
a second plurality of sidewalls;
a second plurality of holes configured to secure a second plurality of grommets gripping a second plurality of server components;
a second plurality of guides configured to guide the second plurality of grommets in a second direction towards the second plurality of holes; and
a second plurality of latches comprising a second plurality of tails configured to strike the second plurality of server components when the second plurality of grommets slide into the second plurality of holes, wherein the first direction is opposite the second direction;
a second plurality of rivets securing the second plurality of sidewalls to the plurality of sides and the floor;
a third SCB comprising a third plurality of holes configured to secure a third plurality of grommets gripping a third plurality of server components; and
a fan wall comprising a plurality of fans to cool at the first plurality of server components, the second plurality of server components, and the third plurality of server components.

14. A method for managing a server chassis bracket (SCB) and a server chassis, comprising:
inserting a first grommet into a single guide of the SCB and a second grommet into a shared guide of the SCB partially covered by a latch, wherein the first grommet and the second grommet grip a server component;

sliding the first grommet towards a first hole using the single guide and the second grommet towards a second hole using the shared guide,
wherein the single guide and the first hole are located within a first cutout in the SCB, and
wherein the shared guide and the second hole are located within a second cutout in the SCB; and
pushing the first grommet past a neck in the first cutout into the first hole and pushing the second grommet past a neck in the second cutout into the second hole,
wherein the latch strikes the server component when the second grommet slides into the second hole to confirm successful installation of the server component.

15. The method of claim 14, wherein the SCB comprises a plurality of sidewalls, wherein the server chassis comprises a floor and a plurality of sides, and wherein the server component is a hard disk.

16. The method of claim 15, further comprising:
securing the plurality of sidewalls to the plurality of sides, wherein securing the plurality of sidewalls reduces sagging of the floor by compressing the plurality of sides and bowing the floor.

17. A method of manufacture, comprising:
obtaining a first server chassis bracket (SCB) comprising a first plurality of sidewalls;
obtaining a server chassis comprising a floor and a plurality of sides; and
securing the plurality of sidewalls to the plurality of sides, wherein securing the plurality of sidewalls reduces sagging of the server chassis by compressing the plurality of sides and bowing the floor.

18. The method of claim 17, further comprising:
obtaining a second SCB comprising a second plurality of sidewalls;
securing the second plurality of sidewalls to the plurality of sides; and
securing the second SCB to the floor.

19. The method of claim 18, wherein the first SCB comprises:
a first plurality of holes configured to secure a first plurality of grommets gripping a first plurality of server components;
a first plurality to guides configured to guide the first plurality of grommets in a first direction towards the first plurality of holes; and
a first plurality of latches comprising a first plurality of tails configured to strike the first plurality of server components when the first plurality of grommets slide into the first plurality of holes.

20. The method of claim 19, wherein the second SCB comprises:
a second plurality of holes configured to secure a second plurality of grommets gripping a second plurality of server components;
a second plurality of guides configured to guide the second plurality of grommets in a second direction towards the second plurality of holes; and
a second plurality of latches comprising a second plurality of tails configured to strike the second plurality of server components when the second plurality of grommets slide into the second plurality of holes.

* * * * *